United States Patent [19]

Boyd

[11] Patent Number: 4,875,004
[45] Date of Patent: Oct. 17, 1989

[54] HIGH SPEED SEMICONDUCTOR CHARACTERIZATION TECHNIQUE

[75] Inventor: Phillip R. Boyd, Upper Marlboro, Md.

[73] Assignee: The United States of America as represented by the Secretary of the Army, Washington, Del.

[21] Appl. No.: 200,813

[22] Filed: Jun. 1, 1988

[51] Int. Cl.$^4$ .................. G01R 31/26; G01R 31/28
[52] U.S. Cl. .................. 324/158 D; 250/492.2; 324/158 R
[58] Field of Search ............ 324/158 D, 158 R, 96; 136/290; 250/310, 311, 492.2, 492.3

[56]  References Cited

U.S. PATENT DOCUMENTS 4,695,794  9/1987  Bargett et al. .................. 324/158 D
4,730,158  3/1988  Kasai et al. .................... 324/158 D

OTHER PUBLICATIONS

Rosbeck et al.; "Background and Temperature ..."; J. Appl. Phys.; 53(9); Sep. 1982; pp. 6430–6440.

Primary Examiner—Ernest F. Karlsen
Attorney, Agent, or Firm—Milton W. Lee; John E. Holford; Anthony T. Lane

[57]  ABSTRACT

The invention provides a test system and method using E-Beam techniques to characterize LSI photodiode arrays in both their electrical and optical properties.

7 Claims, 2 Drawing Sheets

HIGH SPEED SEMICONDUCTOR CHARACTERIZATION TECHNIQUE

The invention described herein may be manufactured, used, and licensed by the U.S. Government for governmental purposes without the payment of any royalties thereon.

BACKGROUND

1. Field

The invention relates to image detecting arrays, specifically far infrared detectors and non-destructive methods of testing Large Scale Integration (LSI) arrays.

2. Prior Art

A typical prior art technique for characterizing and testing a far-infrared photodiode is shown in the article "Background and temperature dependent current-voltage characteristics of HgCdTe photodiodes" by J. P. Rosbeck, et al. in the *Journal of Applied Physics*, Vol. 53, No. 9, September 1982, pp 6430–40. The diode is placed on a cold stage (77° K.) and I-V characteristics are measured by an electrometer and other instruments physically contacting the diode. Each measurement is made while the diode is irradiated at a different frequency in the response spectrum of the diode.

So called, first generation arrays of these diodes have expanded from individual diodes to linear arrays containing hundreds of diodes and testing by such methods has become a very tedious process. Fortunately as confidence in manufacturing techniques has increased the amount of testing required has reduced sufficiently to permit mass production. A new array for second generation far-infrared image detectors involves LSI and will be far too sophisticated for this type of testing.

The new array will have thousands rather than hundreds of diodes. The chip will employ solder-bumps to make the HgCdTe structure to a silicon chip with a highly sophisticated charge coupled device (CCD) to extract the information stored by the diodes. Testing would be simpler after the two chips are mated, but then it would be too difficult to disassemble the device and perhaps salvage one of the chips. Testing the array chip alone by the old methods would take 24 hours or more per chip.

The Siemens Company in Germany has developed an E-Beam Tester Model 8410 which performs high-speed no-load testing of intergrated circuit chips (IC's). The device can be used on chips that are passivated by an oxide coating in a non-destructive manner. First generation arrays were provided with extra diodes on which destructive testing could be performed. The Siemens tester is adequate for testing the second generation CCD chip, but can not adequately test the second generation array chips. An object of the present invention is to provide a tester using the E-Beam principle to fully test the latter chip.

SUMMARY OF THE INVENTION

A high speed tester is provided which combines tuneable lasers and an E-Beam tester to perform both electrical and spectral response measurements on chips having photo-diodes in large scale integrated (LSI) arrays quickly and non-destructively. The tests are performed on completed chips prior to mating. One hundred percent testing can be accomplished in a few hours or random testing of a significant number of sample diodes can be accomplished in a few minutes.

DESCRIPTION OF THE PREFERRED EMBODIMENT

Figure 1:
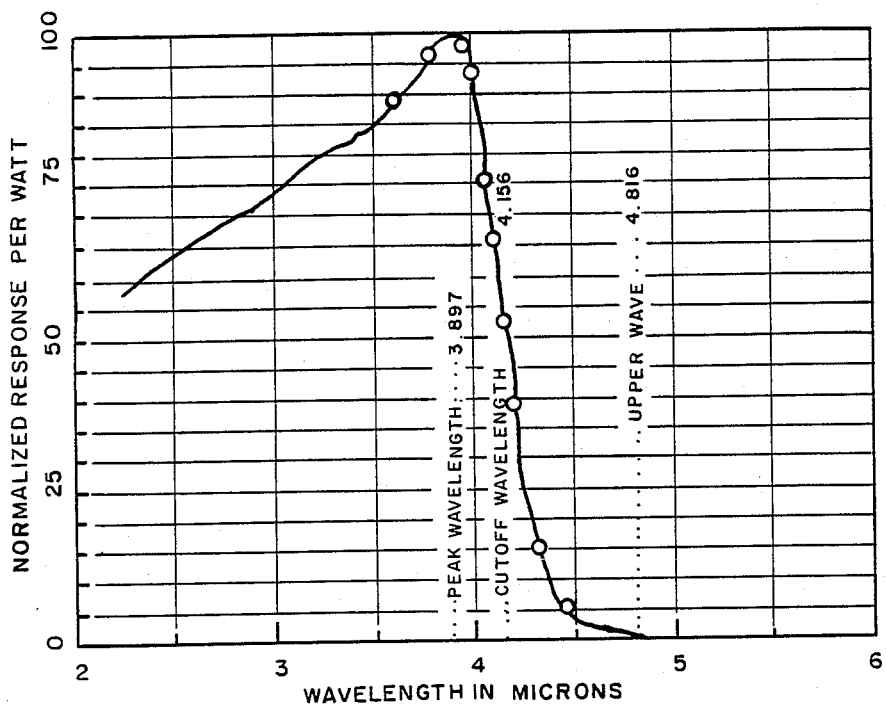
FIG. 1 shows the spectral response of a typical far-infrared photodiode as a function of watts of incident radiation.

As shown in FIG. 1 a typical far-infrared photodiode due to its composition can be designed to have a peak response in volts per watt of incident light at a given wavelength, e.g. 4 microns. At longer wavelengths the response drops quickly as it passes through a cutoff wavelength where it has half the peak response to an upper wavelength limit of substantially zero response. At shorter wavelengths the drop in response is much more gradual.

Figure 2:
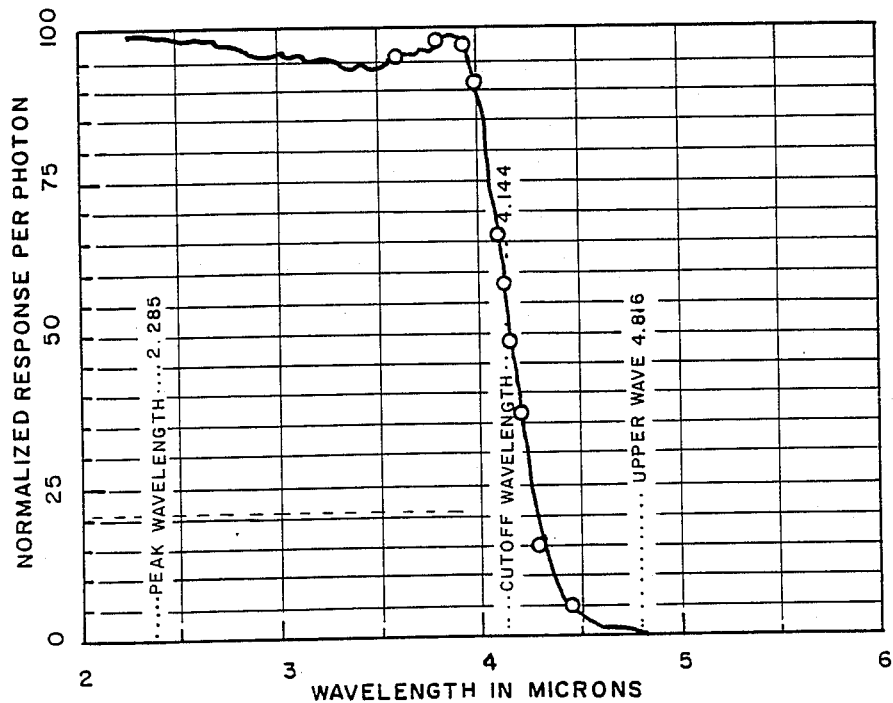
FIG. 2 shows the response of the same diode as a function of incident photons.

FIG. 2 shows another response curve of the same diode. This shows the response in volts per photon. The peak response is shifted to a much shorter wavelength, but the response is actually very flat below the design wavelength of 4 microns. The curves of FIGS. 1 and 2 were generated by over 100 data points, however, these curves can be characterized for test purposes by a much smaller number say 10 points as indicated by the open circles on the curves. Even so this becomes a half a million measurements per LSI array times the number of arrays to be tested.

Figure 3:
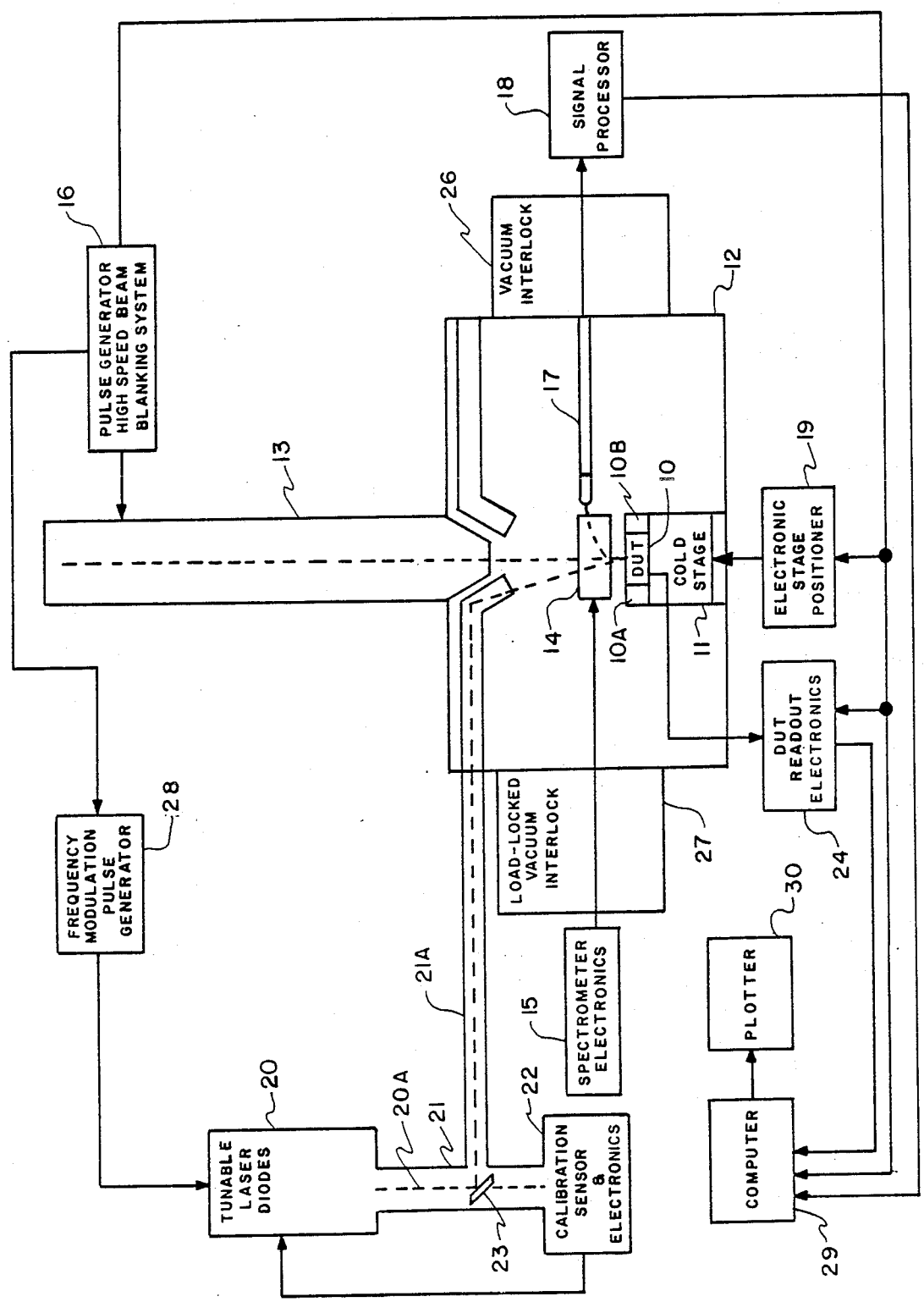
FIG. 3 shows a combined electrical and spectral response tester according to the present invention.

FIG. 3 shows a test system according to the invention. The device under test (DUT) 10 is mounted on a cold stage 11 which is maintained near the boiling point of nitrogen, approximately 77° K., using any convenient cryogenic cooler or a reservoir of liquid nitrogen. Also mounted on this stage are two standard photodiodes 10A and 10B. The stage is mounted within a vacuum chamber 12, movable in x-y directions parallel to the floor of the chamber in response to externally applied electrical signals. The position of the stage correspond to the axis of an E-Beam generator 13 mounted in the center of the roof of vacuum chamber with its axis normal to chamber floor. The E-beam generator is beam coupled to a spectrometer centered in the beam axis between the generator and the cold stage.

Electronics 15 to energize the spectrometer are located outside the vacuum chamber and electrically coupled to the latter through a wall of the chamber. The E-beam generator is controlled by a High Speed Pulse Generator 16 which controls the x-y position of the beam relative to the surface of the DUT over a small portion of the DUT surface. Secondary electrons escape from the surface of the DUT and are detected by a retarding field analyzer coupled to a scintillator and photomultiplier tube 17. The latter is electrically coupled to a signal processor 18 outside the chamber. In order to scan all significant portions of the DUT an Electronic Stage Positioner 19 is coupled to the stage 11 through the floor or wall of the Chamber. It is also coupled to the Pulse Generator 16 so that stage can be moved stepwise after the E-Beam Generator has scanned the area occupied by a set of diodes to another set. The above elements are supplied in conjunction with a model 8410 E-Beam tester made by the Siemens Research Laboratories.

The stage of the Siemens device is adapted for cooling and external electrical communication with the electrodes of the DUT. The output of the Pulse Generator 16 and Signal Processor are fed into a computer 29 which drives a plotter 30 to record the voltages and resulting currents at various points in the DUT, thus completely characterizing its electrical nature. Many modes of operation are provided which supply graphic information on time varying conditions within the DUT. The DUT is thus perceived by the Siemens tester as only an electrically controlled device.

The present invention seeks to characterize an array of photodiodes. Which is essentially an optically controlled device although it definitely has electrical characteristics also. The present design of LSI IR photodetectors is based on a two chip design. To provide diodes that operate in the far-infrared it is necessary to employ II-IV compounds such as mercury-cadmium telluride in the chip which carries the array of photodiodes. The states of the diodes are read by a charge-coupled-device (CCD) which is most economically manufactured on a silicon chip. Both chips are relatively expensive in the LSI version, the silicon chip due to its complexity and the photodiodes due to the materials used. The silicon chip can be readily tested on the Siemens device as provided by the company.

To perform tests of the individual diodes on the photodiode chip a tuneable laser or group of lasers 20 is supplied outside the chamber. The beam 20A from the laser radiates through a vertical evacuated tube 21 to a Calibration Sensor 22 and associated electronics which by feedback retunes the lasers to a selected frequency at the beginning of each test. A horizontal evacuated tube 21A is sealed at right angles to tube 21 forming a common T junction which houses a beam splitter 23. The horizontal tube is sealed through a wall of the vacuum chamber and terminates in an open end between that wall and the axis of the E-Beam Generator. The open end of tube 21A is bent so that the light reflecting inner surface of the bent end portion will deflect the operating laser beam to the entire surface of the cold stage 11. The exact path of beam is controlled by adjustments of the beam splitter's angular position. A tuneable laser may comprise an SP5800 Laser Source Assembly manufactured by Spectra-Physics which uses their SP5600 Tuneable Laser.

The method of characterizing HgCdTe photodiodes using the techniques described above is covered in the article "Background and temperature dependent current-voltage characteristics of HgCdTe photodiodes" by J. P. Rosbeck, et al; Journal of Applied Physics, Vol. 53, No. 9, Sept. 1982, pp 6430–6440. While the E-Beam is scanning the isolated contact for each photodiode, which forms a part of the exposed surface of the DUT, the Frequency Modulation Pulse Generator 28 supplies the required pulses to cause the laser or lasers to modulate through the test spectrum for the photodiodes and a DUT Readout Electronics module 24 extracts the optical spectral response characteristics as a function of the common return current from the common return electrode on the DUT, which contacts the metal portion of the stage. This reading is synchronized with the laser frequency scan as well as the E-Beam scan. Between scans of the DUT photodiodes the E-Beam is deflected to measure standard photodiodes, such as 10A and 10B, which remain on the stage when the DUT is changed. The spectral response data is processed by the computer and recorded by the plotter to permit subsequent analysis and chip evaluation.

The computer may also generate warning signals and early rejection responses to eliminate faulty chips or batches of chips in an assembly line milieu. Access to the chamber is provided through vacuum interlocks, such as interlock 26, in the usual manner. Speedy access is permitted through the use of a load locked vacuum interlock 27 to exchange DUT's. The number of DUT's tested between openings of the interlock can be increased by using a larger stage, with greater stepwise x-y positioning, or additional stages. Special stages can also be devised which automatically exchange DUT's. There are also manipulators available which permit exchanging DUT's, multi-DUT holders, etc. without opening an inerlock. The techniques described above provide the orders of magnitude decrease in test time required by LSI complexity in second generation far-infrared imaging devices and related imaging systems.

If only photodiode arrays are to be tested the spectrometer 14 and its support devices 15, 17 and 18 are not needed. It will be convenient in some cases, however, to test both the photodiode arrays and the CCD's in the same chamber. In some cases a single laser covering a small spectrum near the peak response will suffice. In other cases it may be desirable to provide ten fixed frequency lasers operating in sequence to give the ten values indicated in FIGS. 1 and 2. The preferred test mode changes laser frequency while the E-Beam scans a single diode, but if desired the laser frequency may remain constant while all diodes are scanned.

I claim:

1. A test system for evaluating LSI arrays of photodiodes with an isolated electrode for each diode and a common electrode for all diodes comprising:
   a vacuum chamber including an externally moveable coolable stage means for mounting said array within said chamber;
   an electron beam generator mounted on said chamber and focussed on only one isolated electrode of said array;
   an externally mounted tuneable laser attached to said chamber with a beam irradiating all diodes in same array;
   a current conducting measuring means coupled only between the common electrode of said array and said electron beam generator to measure the electro-optical response of each photodiode as function of current between said generator and said common electrode as well as secondary electron emission from said isolated electrode; and
   a pulse generating means coupled between said common electrode, said beam generator and said laser to redirect the beam from said generator sequentially to each of at least a first set said diodes and to sequentially tune said laser to a plurality of optical frequencies, such that each diode may be irradiated by said plurality of frequencies.

2. A test system according to claim 1, further including:
   at least one standard photodiode permanently mounted on said stage to calibrate said test system.

3. A test system according to claim 1, further including:
   externally controlled means coupled between said stage means and said chamber to reposition said stage such that a different set of isolated diode electrodes is exposed to said beam generator after all diodes in said first set have been so exposed.

4. A system according to claim 1, wherein said current conducting and measuring means includes:
a spectrometer means mounted into said chamber for recording the secondary emission electrons emitted by the surface of said array.

5. A system according to claim 4, further including:
computer and plotter means coupled to said pulse generating means, said current measuring means and said spectrometer means to process and record all data generated by the system.

6. A system according to claim 3, for evaluating arrays with n sets of photodiodes, wherein:
said externally controlled means includes means to reposition said stage sequentially n times to n different positions such that all of said photodiodes are scanned by said electron beam.

7. A system according to claim 6, further including:
an early rejection means to eliminate faulty chips or batches of chips, so as to not waste test time in an assembly line millieu.

* * * * *